(12) United States Patent
Sumita

(10) Patent No.: US 8,035,134 B2
(45) Date of Patent: Oct. 11, 2011

(54) FORWARD BODY BIAS-CONTROLLED SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 427 days.

(21) Appl. No.: 11/812,698

(22) Filed: Jun. 21, 2007

(65) Prior Publication Data

US 2007/0295998 A1  Dec. 27, 2007

(30) Foreign Application Priority Data

Jun. 22, 2006  (JP) ................................. 2006-172468

(51) Int. Cl.
*H01L 23/52* (2006.01)
(52) U.S. Cl. ................ 257/207; 257/203; 257/E27.063; 327/534; 365/154
(58) Field of Classification Search .................. 257/207, 257/E27.063, 203; 327/534; 365/154
See application file for complete search history.

(56) References Cited

U.S. PATENT DOCUMENTS

| | | | |
|---|---|---|---|
| 5,289,500 A * | 2/1994 | Inou et al. ..................... | 375/224 |
| 5,959,821 A | 9/1999 | Voogel | |
| 6,044,020 A * | 3/2000 | Chung et al. ............. | 365/185.23 |
| 6,100,751 A * | 8/2000 | De et al. ........................ | 327/534 |
| 6,396,087 B1 | 5/2002 | Kitabayashi et al. | |
| 6,674,311 B2 * | 1/2004 | Utsunomiya .................... | 327/58 |
| 7,098,510 B2 * | 8/2006 | Kodama et al. ................ | 257/355 |
| 7,514,953 B2 * | 4/2009 | Perisetty .......................... | 326/27 |
| 2001/0036711 A1 * | 11/2001 | Urushima ...................... | 438/460 |
| 2003/0005378 A1 * | 1/2003 | Tschanz et al. ................ | 714/726 |
| 2003/0141582 A1 * | 7/2003 | Yang et al. ..................... | 257/686 |
| 2004/0183588 A1 * | 9/2004 | Chandrakasan et al. ....... | 327/545 |
| 2005/0225365 A1 * | 10/2005 | Wood ............................. | 327/141 |

FOREIGN PATENT DOCUMENTS

| | | |
|---|---|---|
| JP | 2774244 | 8/1995 |
| JP | 2001-148464 | 5/2001 |

OTHER PUBLICATIONS

Miyazaki, et al., "A 175mV Multiply-Accumulate Unit using an Adaptive Supply Voltage and Body Bias (ASB) Architecture", ISSCC 2002/Session 3/Digital Signal Processors Circuits/3.4, Feb. 4, 2002, IEEE.
Chinese Office Action, with English Translation, issued in Chinese Patent Application No. 2007101094608, dated Feb. 12, 2010.

* cited by examiner

*Primary Examiner* — Wael Fahmy
*Assistant Examiner* — John C Ingham
(74) *Attorney, Agent, or Firm* — McDermott Will & Emery LLP

(57) ABSTRACT

In a first functional block, a source voltage input terminal of a PMOS transistor and a substrate voltage input terminal of an NMOS transistor are connected to their voltage supply terminals, respectively. The substrate voltage input terminal of the PMOS transistor in the $i^{th}$ ($1 \leq i \leq n-1$) functional block and the source voltage input terminal of the NMOS transistor therein are connected bijectively with the source voltage input terminal of the PMOS transistor in the $i+1^{th}$ functional block and the substrate voltage input terminal of the NMOS transistor therein. In the $n^{th}$ functional block, the substrate voltage input terminal of the PMOS transistor and the source voltage input terminal of the NMOS transistor are connected to their voltage supply terminals, respectively.

5 Claims, 8 Drawing Sheets

FIG.5
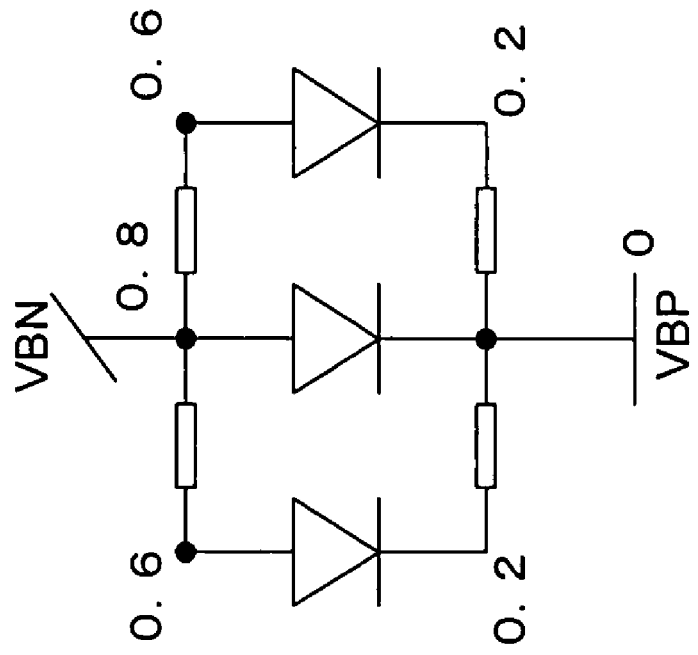
Conventional model
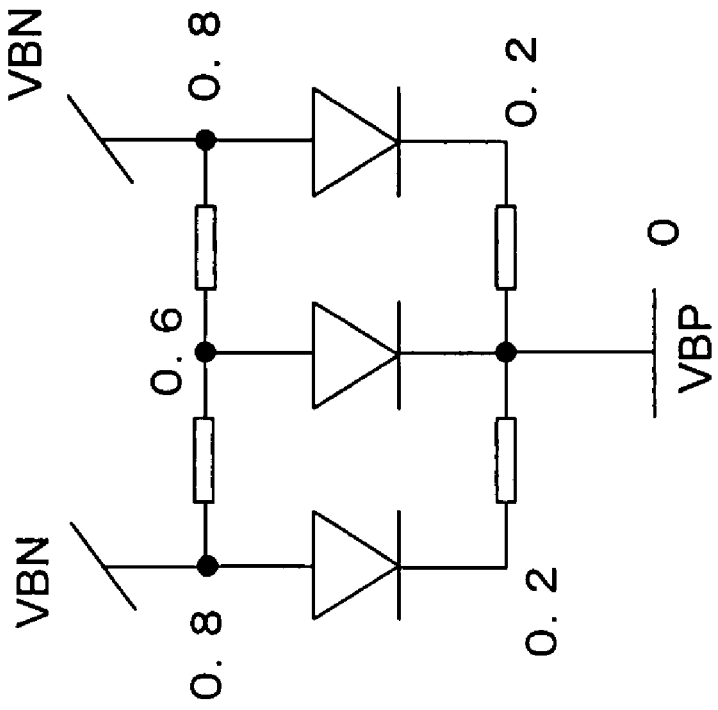
Model of present invention

FORWARD BODY BIAS-CONTROLLED SEMICONDUCTOR INTEGRATED CIRCUIT

CROSS REFERENCE TO RELATED APPLICATIONS

This Non-provisional application claims priority under 35 U.S.C. §119(a) on Patent Application No. 2006-172468 filed in Japan on Jun. 22, 2006, the entire contents of which are hereby incorporated by reference.

BACKGROUND OF THE INVENTION

1. Field of the Invention

The present invention relates to a semiconductor integrated circuit, and more particularly to a technique for reducing the power consumption of a semiconductor integrated circuit to which a forward body bias is applied.

2. Description of the Background Art

Attempts have been made to improve the degree of integration and the operation speed of semiconductor integrated circuits by providing a large number of insulated-gate field effect transistors such as MOSFETs and MISFETs and by reducing the thickness of the gate oxide film while shortening the channel length by miniaturization processes. However, this leads to a decrease in the transistor threshold voltage and an increase in the proportion of the leak current to the power consumption. Moreover, the shortened gate length results in significant variations in characteristics of MOS transistors such as the threshold voltage. As a countermeasure, a DVS (Dynamic Voltage Scaling) technique is known in the art, which realizes a reduction in the power consumption of a semiconductor integrated circuit by suppressing the leak current by dynamically changing the voltage value of the voltage supplied from the power supply circuit according to the amount of processing to be done by a processor and a SOC (System On chip).

With CMOS devices, the characteristics can be improved to some extent by adjusting the source-substrate voltage, i.e., the body bias. Specifically, if a forward body bias (FBB) is applied to a CMOS device, the threshold voltage and the operating voltage of a MOS transistor decrease, thereby making various improvements such as a suppression in the characteristics variations, a decrease in the power consumption, an increase in the operating speed (see, for example, Non-Patent Document 1). With a FBB-controlled semiconductor integrated circuit, the area efficiency is improved by employing a layout in which a substrate potential supply cell including a metal line for supplying the body bias is sandwiched between logic cells (see, for example, Patent Document 1).

Another approach to realizing a lower power consumption is to use charge reusing circuits (so-called "charge recycling circuits") to thereby increase the power conversion efficiency of a power supply circuit, e.g., a linear regulator circuit (see, for example, Patent Document 2).

Patent Document 1: Japanese Laid-Open Patent Publication No. 2001-148464

Patent Document 2: Japanese Patent No. 2774244

Non-Patent Document 1: M. Miyazaki, et al., "A 175 mV Multiply-Accumulate Unit using an Adaptive Supply Voltage and Body Bias (ASB) Architecture", ISSCC 2002/SESSION 3/DIGITAL SIGNAL PROCESSORS AND CIRCUITS/3.4

However, as pointed out in Non-Patent Document 1, if the forward body bias applied to the CMOS device exceeds a certain level, the leak current rapidly increases and the power consumption increases while the frequency characteristics of the CMOS device deteriorate. This is because as the body bias increases, the current flowing through a forward diode, a parasitic bipolar, etc., formed by a P substrate, an N well, a P well, a source region diffusion layer, etc., will have a more significant influence on the CMOS device. Therefore, if an excessively large forward body bias is applied to the CMOS device, it will rather deteriorate the operating characteristics.

In recent years, the power consumption of a semiconductor integrated circuit is reduced by lowering the operating voltage of CMOS devices. However, if a very high forward body bias is applied to a CMOS device operating at a low voltage, the substrate voltage in the N well becomes lower than that in the P well, resulting in a forward current flow in the PN junction diode formed by these wells, whereby the substrate voltage of the P well will be lower than the actually applied body bias. Since there is a forward current in the PN junction diode formed by a P substrate and an N well, the substrate voltage in the N well will be higher than the actually applied body bias. Thus, with CMOS devices operating at low voltages, it is not possible to apply a very large forward body bias, and it is therefore difficult to improve the characteristics by the FBB control. With the layout of a semiconductor integrated circuit disclosed in Patent Document 1, it is difficult to apply a sufficient body bias in portions away from the substrate potential supply cell because of the leak current due to a parasitic bipolar and the well resistance.

Based on the technique disclosed in Patent Document 2, it is possible to expect some reduction in the overall power consumption by dividing the voltage supplied from the power supply circuit and supplying the divided voltages to different stages of semiconductor integrated circuits connected together. In order to increase the number of stages of semiconductor integrated circuits to be connected together, it is necessary to increase the voltage supplied from the power supply circuit. However, increasing the voltage supplied from the power supply circuit by boosting the battery voltage of a battery-powered device, for example, is not practical because the power consumption will be large in other portions. Where the voltage supplied from the power supply circuit is not substantially increased, it is then necessary to lower the operating voltage of the semiconductor integrated circuits. However, it will then be difficult to realize the characteristics improvements by the FBB control.

SUMMARY OF THE INVENTION

In view of the problem set forth above, it is an object of the present invention to reduce the power consumption of, particularly, an FBB-controlled semiconductor integrated circuit.

In view of solving the problem, the present invention is directed to a semiconductor integrated circuit including a first to an $n^{th}$ functional blocks, wherein: a source voltage input terminal of an insulated-gate field effect transistor of a first conductivity type included in the first functional block and a substrate voltage input terminal of an insulated-gate field effect transistor of a second conductivity type included therein are connected to a first and a second voltage supply terminals, respectively; a substrate voltage input terminal of an insulated-gate field effect transistor of the first conductivity type included in an $i^{th}$ (where $1 \leq i \leq n-1$) functional block and a source voltage input terminal of an insulated-gate field effect transistor of the second conductivity type included therein are connected bijectively with a source voltage input terminal of an insulated-gate field effect transistor of the first conductivity type included in an $i+1^{th}$ functional block and a substrate voltage input terminal of an insulated-gate field effect transistor of the second conductivity type included therein; and a substrate voltage input terminal of an insulated-gate field effect transistor of the first conductivity type included in the $n^{th}$ functional block and a source voltage input terminal of an insulated-gate field effect transistor of the second conductivity type included therein are connected to a third and a fourth voltage supply terminals, respectively.

Thus, the substrate current occurring in a functional block located on the higher potential side is collected by a functional block located on the lower potential side. Therefore, even if a substrate current occurs in each of the functional blocks, the overall power consumption of the semiconductor integrated circuit will not increase, whereby it is possible to apply a large forward body bias to a functional block of a lower operating voltage. Thus, it is possible to reduce the overall power consumption of the semiconductor integrated circuit while realizing the characteristics improving effect by the FBB control.

Preferably, the semiconductor integrated circuit further includes an $n+1^{th}$ functional block, wherein: a source voltage input terminal of an insulated-gate field effect transistor of the first conductivity type included in a $j^{th}$ functional block being one of the second to $n-1^{th}$ functional blocks and a substrate voltage input terminal of an insulated-gate field effect transistor of the second conductivity type included in the $n+1^{th}$ functional block are connected together; a substrate voltage input terminal of an insulated-gate field effect transistor of the first conductivity type included in the $j^{th}$ functional block and a source voltage input terminal of an insulated-gate field effect transistor of the second conductivity type included in the $n+1^{th}$ functional block are connected together; a source voltage input terminal of an insulated-gate field effect transistor of the second conductivity type included in the $j^{th}$ functional block and a substrate voltage input terminal of an insulated-gate field effect transistor of the first conductivity type included in the $n+1^{th}$ functional block are connected together; and a substrate voltage input terminal of an insulated-gate field effect transistor of the second conductivity type included in the $j^{th}$ functional block and a source voltage input terminal of an insulated-gate field effect transistor of the first conductivity type included in the $n+1^{th}$ functional block are connected together.

Thus, it is possible to provide two functional blocks (the $j^{th}$ and $n+1^{th}$ functional blocks) that belong to the same one of the multiple stages of functional blocks and yet employ different methods for applying voltages to the sources and substrates of the insulated-gate field effect transistors of the first and second conductivity types.

Preferably, the semiconductor integrated circuit further includes a plurality of constant voltage circuits for supplying predetermined voltages to a substrate voltage input terminal of an insulated-gate field effect transistor of the first conductivity type included in each of the first to $n-1^{th}$ functional blocks and to a source voltage input terminal of an insulated-gate field effect transistor of the second conductivity type included therein, respectively.

Thus, it is possible to more precisely supply a substrate current from a functional block located on the higher potential side to a functional block located on the lower potential side.

More preferably, at least one of the plurality of constant voltage circuits includes four voltage output terminals connected to the source voltage input terminals and the substrate voltage input terminals of the insulated-gate field effect transistors of the first and second conductivity types included in one of the first to $n^{th}$ functional blocks, respectively, and a voltage selected according to an input signal is output from each of the four voltage output terminals.

Thus, the source voltage and the substrate voltage to be applied to a particular functional block can be changed as necessary, and the voltages can be made equal to one another to thereby stop the functional block, thus reducing the power consumption.

More preferably, at least one of the plurality of constant voltage circuits includes an operational amplifier receiving, as differential input voltages, a given reference voltage and the predetermined voltage supplied from the constant voltage circuit; and the operational amplifier operates by receiving a voltage supplied from one of the first and second voltage supply terminals and a voltage supplied from one of the third and fourth voltage supply terminals.

Thus, the operating voltage of the operational amplifier is sufficiently higher than the reference voltage and the predetermined voltage supplied from the constant voltage circuit, thereby improving the voltage output precision of the constant voltage circuit.

Preferably, at least one of the first to $n^{th}$ functional blocks has a triple-well structure including a semiconductor substrate of a first one of the first and second conductivity types with a retrograde well of a second one of the first and second conductivity types being formed on the semiconductor substrate, and with a well of the first one of the first and second conductivity types being formed on the retrograde well; and the retrograde well is insulated from the semiconductor substrate by an insulating layer.

Thus, even if a forward body bias is applied to each well, no current flows between the well and the semiconductor substrate, whereby it is possible to reduce the power consumption of the semiconductor integrated circuit.

Preferably, at least one of the first to $n^{th}$ functional blocks includes: a plurality of first lines for supplying a substrate voltage for an insulated-gate field effect transistor of the first conductivity type included in the functional block; and a plurality of second lines for supplying a substrate voltage for an insulated-gate field effect transistor of the second conductivity type included in the functional block, wherein the first and second lines extend parallel to each other and alternate with each other, with the insulated-gate field effect transistors of the first and second conductivity types being interposed therebetween.

Thus, a transistor located away from the first line is close to the second line, and a transistor located close to the first line is away from the second line, whereby a uniform body bias can be applied to transistors interposed between the first and second lines, irrespective of the distance of each transistor from the first and second lines. Therefore, it is possible to reduce the power consumption of an FBB-controlled semiconductor integrated circuit while improving the layout efficiency.

More preferably, the at least one functional block includes a line control section for thinning out voltages supplied through the plurality of first and second lines according to a magnitude of a forward body bias to be applied to each of the insulated-gate field effect transistors of the first and second conductivity types included in the functional block.

Thus, it is possible to further reduce the power consumption in a case where it is not necessary to apply a large forward body bias.

More preferably, the at least one functional block has a triple-well structure including a semiconductor substrate of a first one of the first and second conductivity types with a retrograde well of a second one of the first and second conductivity types being formed on the semiconductor substrate, and with a well of the first one of the first and second conductivity types being formed on the retrograde well; and one of the first and second lines that supplies a substrate voltage to an insulated-gate field effect transistor of the second one of the first and second conductivity types is located on the retrograde well outside a region of the well.

Thus, one of the first and second lines can be placed on a retrograde well outside the well region of the CMOS device, thus further improving the layout efficiency.

The present invention is also directed to a semiconductor integrated circuit, wherein the semiconductor integrated circuit has a triple-well structure including a semiconductor substrate of a first conductivity type with a retrograde well of a second conductivity type being formed on the semiconductor substrate, and with a well of the first conductivity type being formed on the retrograde well, wherein the retrograde well is insulated from the semiconductor substrate by an insulating layer.

Thus, even if a forward body bias is applied to each well, no current flows between the well and the semiconductor substrate, whereby it is possible to reduce the power consumption of the semiconductor integrated circuit.

The present invention is also directed to a semiconductor integrated circuit, including: insulated-gate field effect transistors of a first and a second conductivity types; a plurality of first lines for supplying a substrate voltage for the insulated-gate field effect transistor of the first conductivity type; and a plurality of second lines for supplying a substrate voltage for the insulated-gate field effect transistor of the second conductivity type, wherein the first and second lines extend parallel to each other and alternate with each other, with the insulated-gate field effect transistors of the first and second conductivity types being interposed therebetween.

Thus, a transistor located away from the first line is close to the second line, and a transistor located close to the first line is away from the second line, whereby a uniform body bias can be applied to transistors interposed between the first and second lines, irrespective of the distance of each transistor from the first and second lines. Therefore, it is possible to reduce the power consumption of an FBB-controlled semiconductor integrated circuit while improving the layout efficiency.

BRIEF DESCRIPTION OF THE DRAWINGS

FIG. 5 shows a circuit model of the present invention and that of a conventional technique.

DESCRIPTION OF THE PREFERRED EMBODIMENTS

Preferred embodiments of the present invention will now be described with reference to the drawings.

First Embodiment

Figure 1:
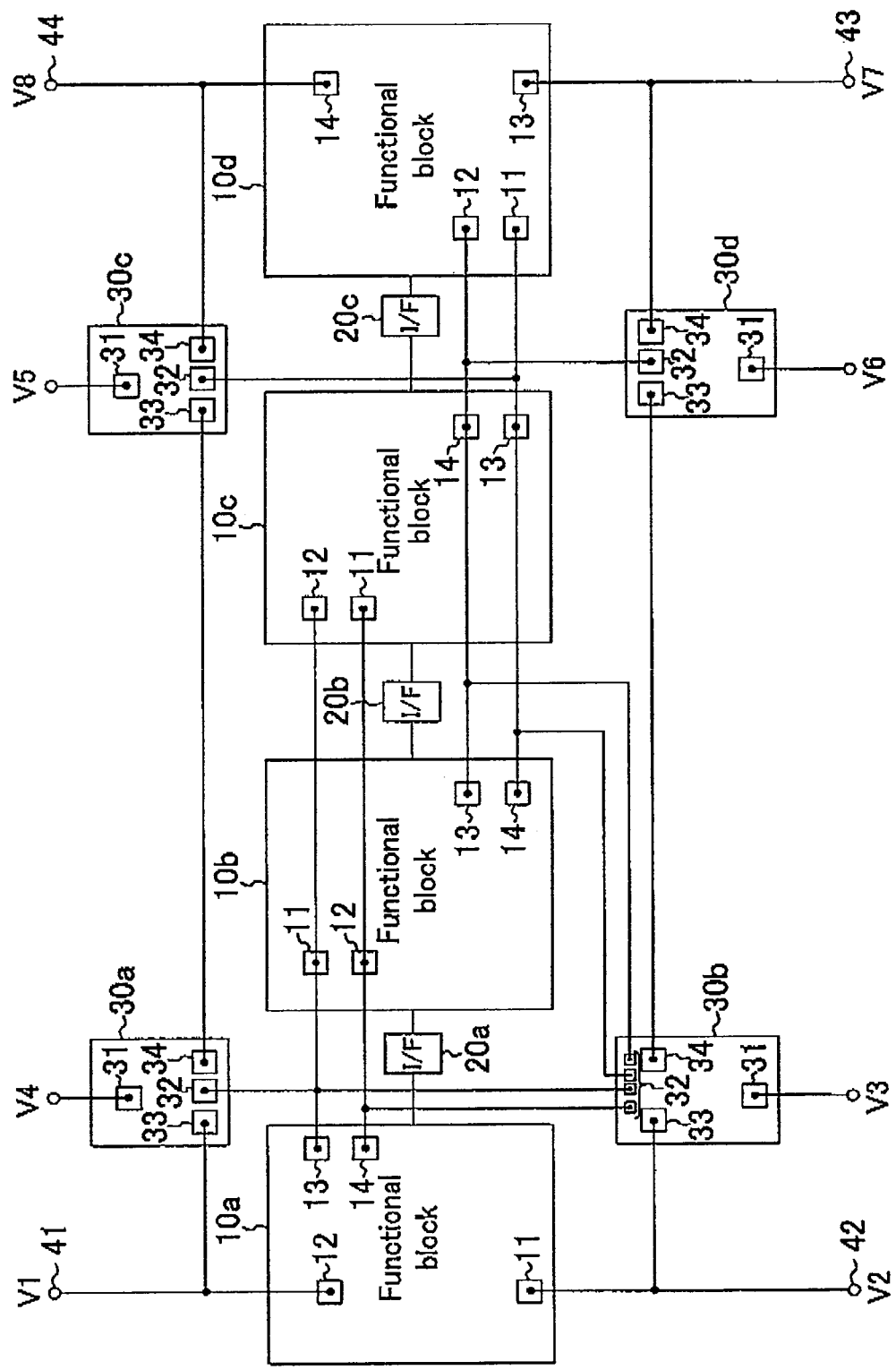
FIG. 1 shows a configuration of a semiconductor integrated circuit according to a first embodiment of the present invention.

FIG. 1 shows a configuration of a semiconductor integrated circuit according to a first embodiment of the present invention. The present semiconductor integrated circuit includes four functional blocks 10a, 10b, 10c and 10d, three interface circuits 20a, 20b and 20c, and four constant voltage circuits 30a, 30b, 30c and 30d. In the following description, the suffix letter is omitted when the reference is made to any or all of the functional blocks or the constant voltage circuits.

Each functional block 10 includes voltage input terminals 11 and 13 for supplying the source voltage and the substrate voltage, respectively, to a PMOS transistor (not shown), and includes voltage input terminals 12 and 14 for supplying the substrate voltage and the source voltage, respectively, to an NMOS transistor (not shown), thus enabling an FBB control. The voltage input terminals 12 and 11 of the functional block 10a are connected to a voltage supply terminal 41 for supplying a voltage V1 (e.g., 3.3 V) and a voltage supply terminal 42 for supplying a voltage V2 (e.g., 2.9 V), respectively. The voltage input terminals 13 and 14 of the functional block 10a are connected to the voltage input terminals 11 and 12 of the functional block 10b, respectively. The voltage input terminals 13 and 14 of the functional block 10b are connected to the voltage input terminals 12 and 11 of the functional block 10d, respectively. The voltage input terminals 11 to 14 of the functional block 10c are connected to the voltage input terminals 12, 11, 14 and 13 of the functional block 10b, respectively. The voltage input terminals 13 and 14 of the functional block 10d are connected to a voltage supply terminal 43 for supplying a voltage V7 (e.g., 1.4 V) and a voltage supply terminal 44 for supplying a voltage V8 (e.g., 1.0 V), respectively.

The voltages V1 to V8 are supplied from a power supply circuit outside the semiconductor integrated circuit or an internal power supply circuit (not shown). These voltages may be changed as necessary depending on the external environment and other conditions that influence the realization of the functions of the present semiconductor integrated circuit, e.g., how well the process is done, the ambient temperature, the amount of processing to be performed by each functional block 10, the soft error resistance of each functional block 10, etc.

Interface circuits 20 are provided between the functional blocks 10 to realize communications between the functional blocks 10. Since each functional block 10 has a different operating voltage, a through current flows if signal input/output terminals of different functional blocks 10 are connected directly to each other. Therefore, communications are made via the interface circuits 20 therebetween. Specifically, an interface circuit 20 may be a level shift circuit, a photocoupler circuit, or the like. The interface circuit 20 may alternatively be an interface circuit for realizing wireless communications between the functional blocks 10 such as those employed with non-contact IC cards.

Each constant voltage circuit 30 receives a reference voltage at a voltage input terminal 31, and supplies from a voltage output terminal 32 a predetermined voltage corresponding to the reference voltage to the voltage input terminals of the functional blocks 10 except for the voltage input terminals 11 and 12 of the functional block 10a and the voltage input terminals 13 and 14 of the functional block 10d. Specifically, the constant voltage circuit 30a supplies the reference voltage V4 (e.g., 2.3 V) to the voltage input terminal 13 of the functional block 10a. The constant voltage circuit 30b supplies the reference voltage V3 (e.g., 2.7 V) to the voltage input terminal 14 of the functional block 10a. The constant voltage circuit 30c supplies the reference voltage V5 (e.g., 2.1 V) to the voltage input terminal 14 of the functional block 10b. The constant voltage circuit 30d supplies the reference voltage V6 (e.g., 1.7 V) to the voltage input terminal 13 of the functional block 10b.

Figure 2:
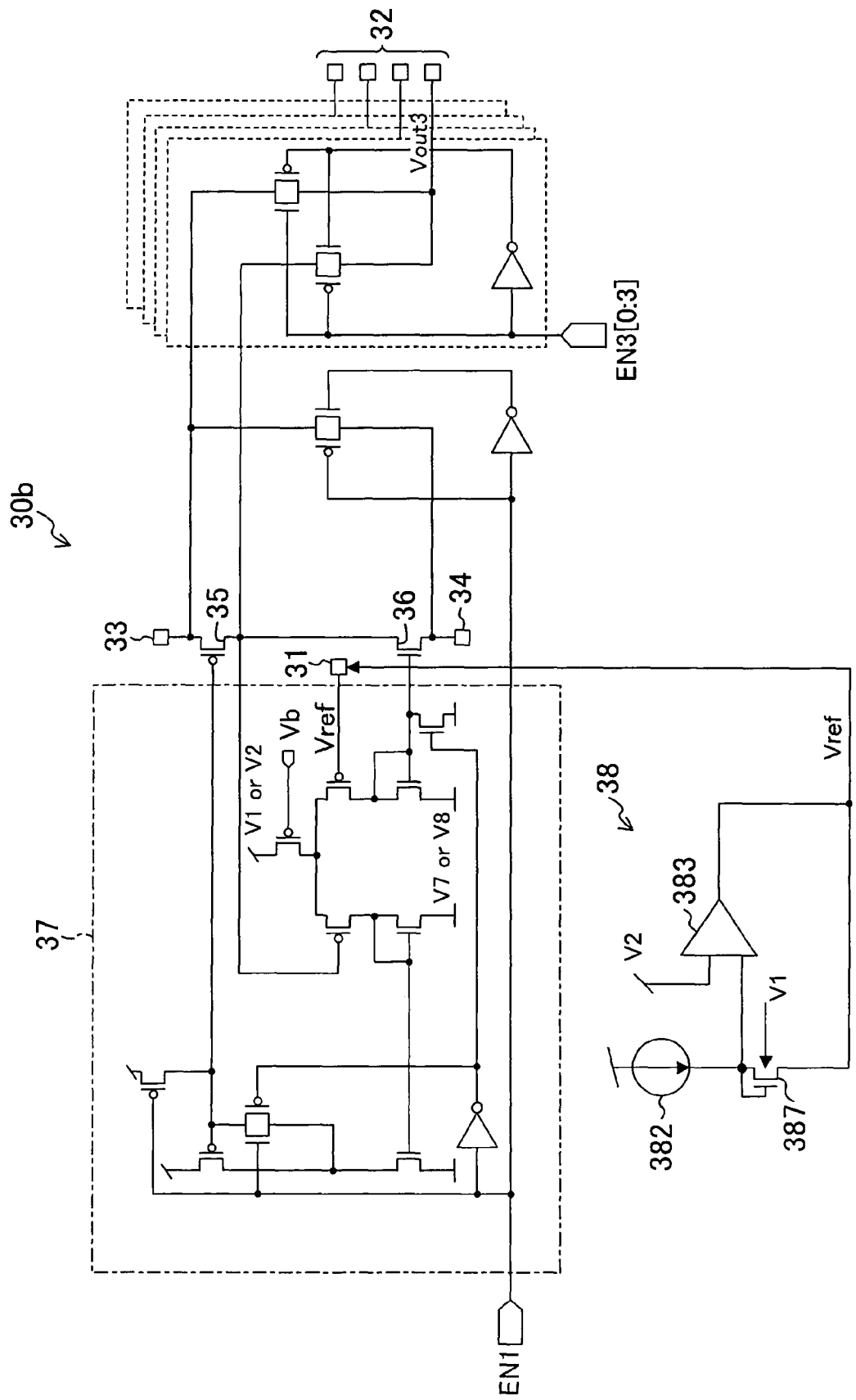
FIG. 2 shows an example of a circuit configuration of a constant voltage circuit.

The constant voltage circuit 30b among others includes four voltage output terminals 32 connected to the voltage input terminals 11 to 14 of the functional block 10b, and selectively outputs a voltage according to the input signal from each of the voltage output terminals 32. FIG. 2 shows an exemplary circuit configuration of the constant voltage circuit 30b. The constant voltage circuit 30b includes a PMOS transistor 35 and an NMOS transistor 36 whose source electrodes are connected to the terminals 33 and 34, respectively, and an OTA 37 receiving, as differential input voltages, the reference voltage Vref applied to the voltage input terminal 31 and the voltage Vout3 of the voltage output terminal 32. When a signal EN1 is at "L", the terminal 33 and the terminal 34 are shorted together to be at substantially the same potential, and the voltage output terminal 32 is in a high impedance state. When the signal EN1 is at "H", the OTA 37 is activated, whereby the gate voltages of the transistors 35 and 36 are adjusted so that the voltage Vout3 and the voltage Vref are equal to each other. Thus, it is possible to stabilize the voltage of the voltage output terminal 32 only with the power consumption by the OTA 37.

The reference voltage Vref may be generated by a feedback circuit 38. In the feedback circuit 38, an NMOS transistor 381 in which the drain and the gate are connected to each other receives bias current from a current source 382 to operate in the saturation region. Further, voltage V1 as the substrate voltage is applied to the NMOS transistor 381. The output terminal of an operation amplifier 383, to which the drain voltage of the NMOS transistor 381 and the voltage V2 are input, is connected to the source of the NMOS transistor 381, so that the reference voltage Vref is supplied from the connection point therebetween. With this feedback structure, constant saturation current flows in the NMOS transistor 381 irrespective of variations in voltage V1 and peripheral temperature and variation in manufacture, leading to stable supply of the reference voltage Vref.

The voltages of the four voltage output terminals 32 in the constant voltage circuit 30b can be switched from one to another by a 4-bit signal EN3. For example, when any bit of the signal EN3 is at "H", the corresponding voltage output terminal 32 and the terminal 33 are shorted together to be at substantially the same potential. With all bits of the signal EN3 being at "H", the voltage applied to the terminal 33 is supplied from all of the four voltage output terminals 32, whereby the same voltage is supplied to the voltage input terminals 11 to 14 of the functional block 10b. As a result, the functional block 10b does not operate, and the power consumption thereby can be made substantially zero. This is particularly effective for temporarily disabling the functional block 10b when the function of the functional block 10b is not needed. Moreover, it is possible to reduce the leak current in the functional block 10b by appropriately changing the various voltages to be supplied to the functional block 10b depending on the amount of signal processing to be performed by the functional block 10b.

It is preferred that the OTA 37 operates while receiving one of the voltages V1 and V2 and one of the voltages V7 and V8. Then, the operating voltage of the OTA 37 can be made sufficiently high, and it is possible to enhance the precision of the comparison between the voltage Vref and the voltage Vout3. Where the comparison precision is not required, the operating voltage of the OTA 37 can be low. Then, the power consumption by the OTA 37 is reduced. The constant voltage circuit 30a, 30c and 30d have substantially the same circuit configuration as that of the constant voltage circuit 30b, except for the number of the voltage output terminals 32.

Figure 3:
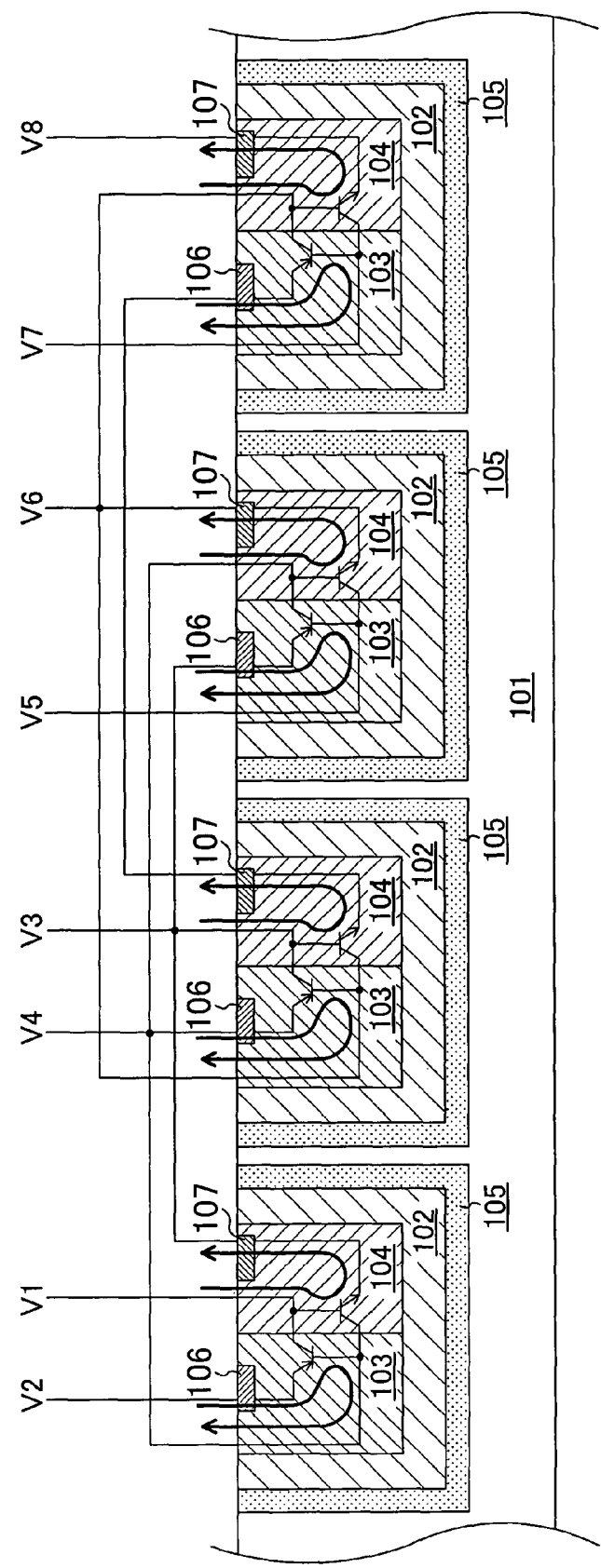
FIG. 3 is a cross-sectional view showing a semiconductor integrated circuit shown in FIG. 1.

FIG. 3 shows a cross section of the present semiconductor integrated circuit. The four CMOS devices shown in FIG. 3 each represent a CMOS device included in the functional blocks 10a to 10d shown in FIG. 1. The present semiconductor integrated circuit includes a P substrate 101 and a DN well (retrograde well) 102 formed on the P substrate 101, with an N well 103 and a P well 104 being formed on the DN well 102, thus forming a triple-well structure. Particularly, the DN well 102 is insulated from the P substrate 101 by an insulating layer 105 made of $SiO_2$, or the like.

In FIG. 3, a PNP-type bipolar including a P-type diffusion layer 106, the DN well 102, the N well 103 and the P well 104 and an NPN-type bipolar including an N-type diffusion layer 107, the P well 104, the N well 103 and the DN well 102, which are parasitic on each CMOS device of the present semiconductor integrated circuit, are shown to be overlapping each other. Consider a case where the current gain (collector current/base current) of the PNP-type bipolar is "0.2" and that of the NPN-type bipolar is "2". Since the current gain of the PNP-type bipolar is less than or equal to 1, a current flows out of the DN well 102 and the N well 103, being the base of the PNP-type bipolar. For the NPN-type bipolar, a current flows out of the P well 104 being the emitter thereof. Thus, the substrate current of a CMOS device included in a functional block 10 is supplied to the next functional block 10 through a line connected to the voltage input terminals 14 and 13 as indicated by arrows in FIG. 3. Thus, by re-using the substrate current occurring in a functional block 10 in the next and subsequent functional blocks 10, the power consumption through the substrate current by the functional blocks 10, except for the last block, can be made substantially zero, thereby realizing a reduction in the overall power consumption of the semiconductor integrated circuit. In each functional block 10, there is no problem even when the substrate current increases. Therefore, even if the operating voltage of each functional block 10 is low, it is allowed to apply a larger forward body bias. Thus, it is possible to improve various characteristics such as the operating speed of each functional block 10.

For example, consider a case where the operating frequency of a functional block 10 when the operating voltage is set to 0.6 V without applying a forward body bias is realized by setting the operating voltage to 0.4 V with the application of a forward body bias of 0.8 V. Then, where the maximum voltage to be applied to the semiconductor integrated circuit is 3.6 V, the maximum number of stages of functional blocks 10 without the application of the forward body bias is 6, and that with the application of the forward body bias is 9. Thus, by lowering the operating voltage of the functional block 10 and applying the forward body bias, more functional blocks 10 can be connected together within the same maximum voltage. Therefore, the re-usage rate of the substrate current in each functional block 10 is improved, and it is possible to further reduce the overall power consumption of the semiconductor integrated circuit.

The present semiconductor integrated circuit is an example where three functional blocks 10a, 10b and 10d are connected between the voltage V1 and the voltage V8. Specifically, the substrate current in the functional block 10a of the first stage is applied to each of the functional blocks 10b and 10c of the second stage, and the substrate current in the functional blocks 10b and 10c is supplied to the functional block 10d of the third stage. The functional blocks 10b and 10c of the second stage are different from each other only in terms of how the voltages V3 to V6 are applied. Specifically, the operating voltage of the functional block 10b is 0.2 V (=V4−V5), and that of the functional block 10c is 1.0 V (=V3−V6). Thus, a large number of stages of the functional blocks 10 may be connected together, while connecting functional blocks 10 of different operating voltages in parallel to each other within the same stage.

It is noted that the NMOS transistor 381 of the feedback circuit 38 shown in FIG. 2 is preferably formed similarly to the CMOS device shown in FIG. 3, namely, is formed in the DN well 102 insulated from the P substrate 101 by the insulating layer 105. This reduces variation in manufacture.

Figure 4:
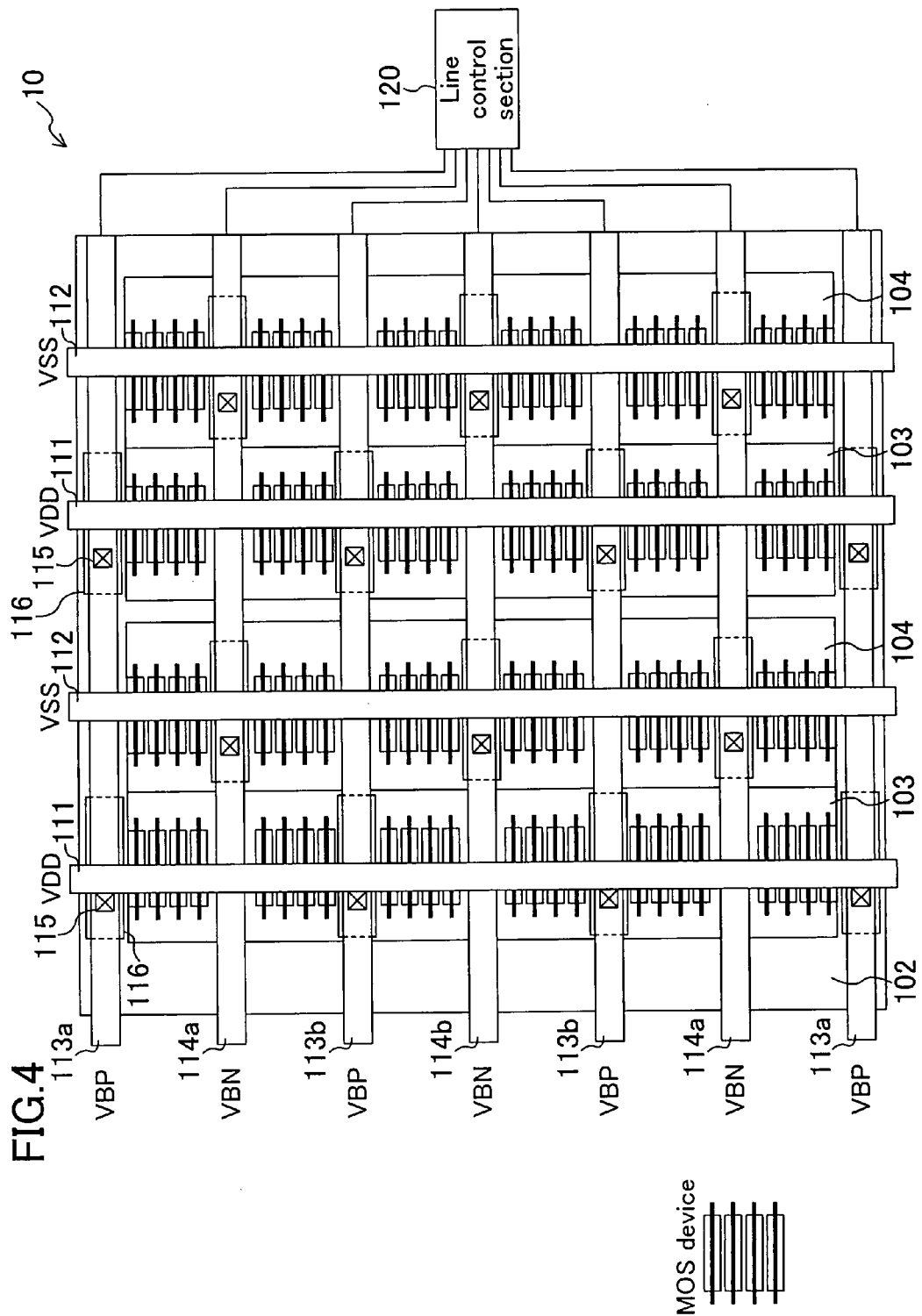
FIG. 4 shows a layout of various metal lines of functional blocks.

FIG. 4 shows a layout of various metal lines of a functional block 10. The functional block 10 includes a plurality of lines 111 for supplying the source voltage VDD of the PMOS transistor, a plurality of lines 112 for supplying the source voltage VSS of the NMOS transistor, a plurality of lines 113a and 113b for supplying the substrate voltage VBP of the PMOS transistor, a plurality of lines 114a and 114b for supplying the substrate voltage VBN of the NMOS transistor, and a line control section 120. The lines 111 and 112 are parallel to and alternating with each other. The line 113a (or 113b) and the line 114a (or 114b) are parallel to and alternating with each other, with the CMOS device being sandwiched therebetween. These lines are connected to a substrate contact region 116 on the N well 103 and the P well 104 via a contact 115.

Specifically, the lines 113a and 113b are provided on the DN well 102 outside the region of the N well 103. Thus, as it is made possible to supply the substrate voltage VBP of the PMOS transistor by providing the substrate contact region 116 in the outermost area of the N well, which is usually not used, the layout efficiency of the semiconductor integrated circuit is improved.

The effect obtained from the above line layout will be described using a circuit model. FIG. 5 shows a circuit model in a case where a forward body bias such that the bipolar in the parasitic thyristor is not activated is applied. Strictly, the circuit model has a bipolar structure but includes herein diodes formed by P and N wells and well resistors for the sake of explanation. With the conventional circuit model shown in the right half of FIG. 5, where the voltages VBN and VBP are 0.8 V and 0 V, respectively, a body bias of 0.8 V (=0.8−0) is applied to the CMOS device in the vicinity of the substrate potential supply cell, but the body bias applied to the CMOS device away from the substrate potential supply cell is as low as 0.4 V (=0.6−0.2) due to the influence of a voltage drop through the well resistors. In contrast, with the circuit model based on the present invention shown in the left half of FIG. 5, a body bias of 0.6 V (=0.8−0.2) is applied to the CMOS device anywhere in the circuit. Thus, with the layout shown in FIG. 4, a uniform body bias can be applied across the entire current. Therefore, the amount of outflow of the substrate current in the PMOS transistor increases, thus improving the re-usage rate of the substrate current. In a case where a forward body bias such that the bipolar in the parasitic thyristor is activated is applied, the emitter resistance and the base resistance increase and the base-emitter voltage decreases as compared with the conventional technique, whereby it is possible to reduce the leak current through the parasitic bipolar. Therefore, the layout shown in FIG. 4 can be employed for any of the functional blocks 10 in the present semiconductor integrated circuit.

Referring back to FIG. 4, the line control section 120 performs an operation of thinning out the substrate voltages supplied through the lines 113a, 113b, 114a and 114b according to the magnitude of the forward body bias to be applied to the CMOS device. Specifically, in a case where a relatively large forward body bias (e.g., 0.8 V) should be applied, the line control section 120 validates all of the voltages supplied through the lines 113a, 113b, 114a and 114b. In a case where the forward body bias to be applied is relatively small (e.g., 0.4 V), the line control section 120 stops the voltage supply from the lines 113b and 114b by, for example, cutting these lines off the power supply circuit. Thus, it is possible to further reduce the power consumption.

With the layout shown in FIG. 4, even if the N well 103 and the P well 104 have different well resistances (e.g., where the substrate resistance of the N well 103 is relatively small, and the substrate resistance of the P well 104 is relatively large), it is possible to apply a uniform body bias across the entire circuit by locating the substrate contact region 116 on the P well 104 at such a position that is equally distant from the substrate contact regions 116 on the adjacent N wells 103.

Applications of the present semiconductor integrated circuit include multi-core processors for parallel processing, reconfigurable processing elements, and memory devices. In these applications, it is possible to reduce the power consumption by assigning a functional block 10 to each core processor, each processing element and each data holding circuit.

With regard to the multi-stage configuration of the functional blocks 10, it is preferred that functional blocks 10 of higher power consumption levels are located closer to the higher potential side. This increases the variety of voltage values to choose from for the voltage to be supplied to a functional block 10 where it is intended to apply a very large forward body bias to the functional block 10 so as to realize the effect thereof. Therefore, it is preferred that those in which the switching rate (activation rate) of the CMOS device is higher, those of higher operating frequencies, those including more CMOS devices, those including MOS transistors with thinner gate oxide films, those including MOS transistors with lower threshold voltages, and the like, are located closer to the higher potential side.

Conversely, it is preferred that functional blocks 10 of lower power consumption levels are located closer to the lower potential side. For example, in a functional block 10 having an FDSOI structure, the parasitic bipolar is present only on the back surface of the transistor and there is no parasitic bipolar having a thyristor configuration, whereby no excessive substrate current is consumed. Moreover, those using adiabatic circuits and those functioning as memory devices have lower power consumption levels. Therefore, those functional blocks 10 should be located in the last stage.

As described above, according to the present embodiment, functional blocks of low operating voltages are connected in many stages, whereby it is possible to apply a sufficiently large forward body bias to each functional block. Thus, it is possible to realize a semiconductor integrated circuit with low power consumption and desirable operating characteristics.

While it is not necessary to insulate the DN well 102 from the P substrate 101, the insulation therebetween results in a particularly large amount of current flowing out of each functional block 10, and makes it possible to eliminate the substrate current flowing from the P substrate 101 to the DN well 102 and the N well 103. Therefore, for a functional block 10, alone, an increase or decrease of the substrate voltage is less likely to occur even if a very large forward body bias is applied when the operating voltage of the CMOS device included in the functional block 10, whereby it is more likely that some characteristics improvement can be realized by the FBB control. Moreover, in a case where the DN well 102 is insulated from the P substrate 101, the whole structure may be the insulating layer without leaving any P substrate layer between isolation regions. Then, it is possible to eliminate the extra step in the production process of masking the insulating structure between functional blocks 10, and it is possible to produce the present semiconductor integrated circuit more easily.

The number of stages of functional blocks 10 is not limited to 3. Four or more stages of functional blocks 10 may be connected together by the above-described method. For example, a 4-stage configuration can be realized by not connecting the voltage input terminals 13 and 14 of the functional block 10b with the voltage input terminals 14 and 13 of the functional block 10c and by connecting the voltage input terminals 11 and 12 of the functional block 10c to the voltage input terminals 13 and 14 of the functional block 10b but not the voltage input terminals 12 and 11 thereof.

Second Embodiment

Figure 6:
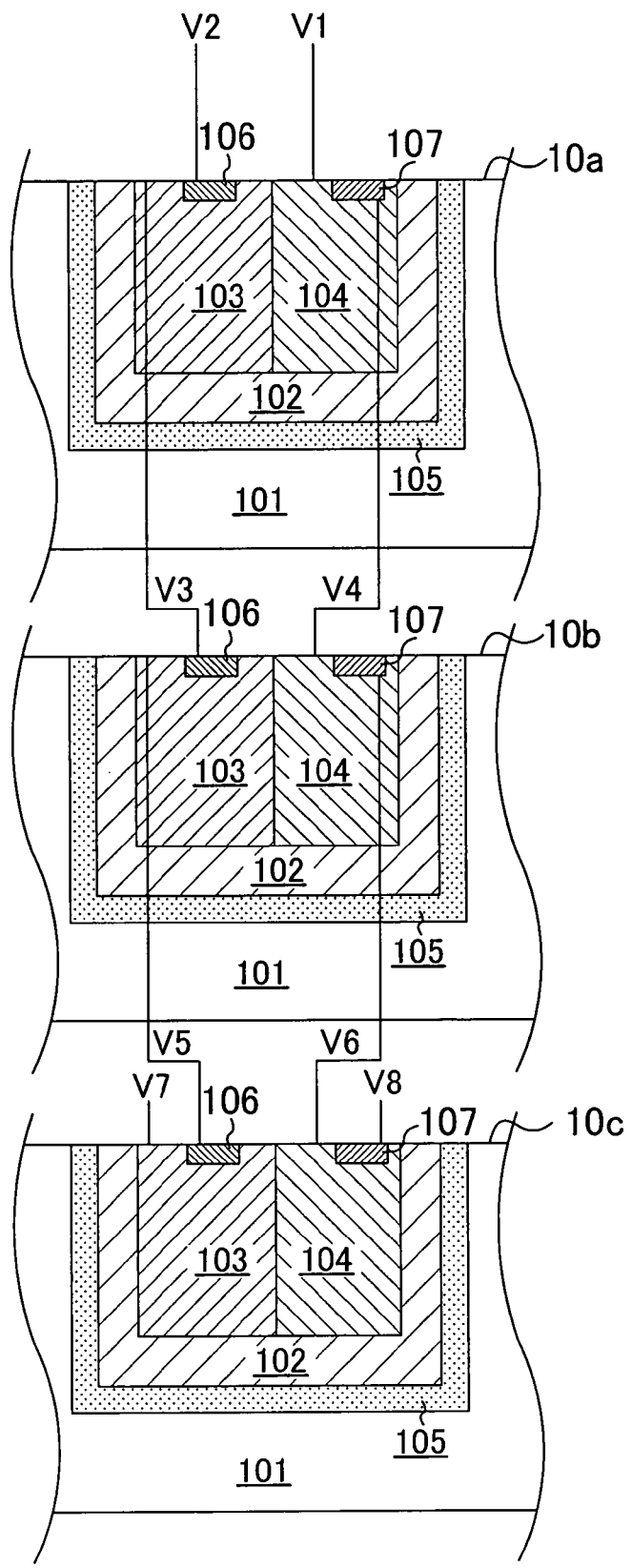
FIG. 6 is a cross-sectional view showing a semiconductor integrated circuit according to a second embodiment of the present invention.

FIG. 6 shows a cross section of a semiconductor integrated circuit according to a second embodiment of the present invention. The present semiconductor integrated circuit is obtained by placing the functional blocks 10a, 10b and 10c, which are implemented as individual chips, into a single package by means of the SIP technique while maintaining the same connection pattern as that in the first embodiment. The three CMOS devices shown in FIG. 6 represent CMOS devices included in the functional blocks 10a to 10c, respectively. As in the semiconductor integrated circuit of the first embodiment, the present semiconductor integrated circuit has a triple-well structure in which the DN well 102 and the P substrate 101 are insulated from each other by the insulating layer 105. The insulating layer 105 may be absent.

The voltage V1 (e.g., 3.3 V) is applied to the source region of the PMOS transistor included in the functional block 10a, and the voltage V2 (e.g., 2.9 V) is applied to the substrate region of the NMOS transistor included therein. The substrate region of the PMOS transistor included in the functional block 10a and the source region of the PMOS transistor included in the functional block 10b are connected to each other, and the voltage V3 (e.g., 2.7 V) is applied thereto. The source region of the NMOS transistor included in the functional block 10a and the substrate region of the NMOS transistor included in the functional block 10b are connected to each other, and the voltage V4 (e.g., 2.3 V) is applied thereto. The substrate region of the PMOS transistor included in the functional block 10b and the source region of the PMOS transistor included in the functional block 10c are connected to each other, and the voltage V5 (e.g., 2.1 V) is applied thereto. The source region of the NMOS transistor included in the functional block 10b and the substrate region of the NMOS transistor included in the functional block 10c are connected to each other, and the voltage V6 (e.g., 1.7 V) is applied thereto. The voltage V7 (e.g., 1.5 V) is applied to the substrate region of the PMOS transistor included in the functional block 10c, and the voltage V8 (e.g., 1.1 V) is applied to the source region of the NMOS transistor included therein. The functional blocks 10 are connected to one another by way of through-vias.

The voltages V1 to V8 are supplied from a power supply circuit outside the semiconductor integrated circuit or an internal power supply circuit (not shown). These voltages may be changed as necessary depending on the external environment and other conditions that influence the realization of the functions of the present semiconductor integrated circuit, e.g., how well the process is done, the ambient temperature, the amount of processing to be performed by each functional block 10, the soft error resistance of each functional block 10, etc.

The means for connecting the functional blocks 10 together is not limited to through-vias, but the functional blocks 10 may be connected together by wire bonding or via pads attached together. The communications between the functional block 10 may be realized by wired interface circuits, or wirelessly or via photo-coupling. For example, it is possible to reduce the power consumption by the communications between IC cards by employing a wireless scheme such as those employed with non-contact IC cards.

Applications

Figure 7:
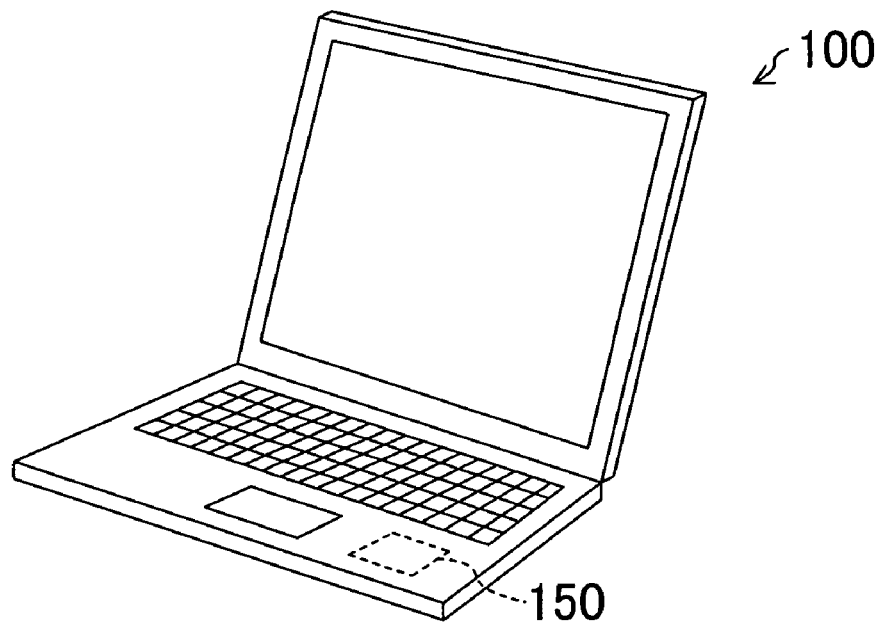
FIG. 7 is a schematic diagram showing an information device including a semiconductor integrated circuit of the present invention.

FIG. 7 is a schematic diagram showing an information device including a semiconductor integrated circuit of the present invention. A notebook PC 100 includes a CPU 150 having a circuit configuration as described above. Since a semiconductor integrated circuit of the present invention can operate with smaller power consumption as compared with conventional techniques, the CPU 150 and the notebook PC 100 including the same can also operate with low power consumption. The semiconductor integrated circuit of the present invention is applicable to information devices in general, including portable information terminals and portable music players.

Figure 8:
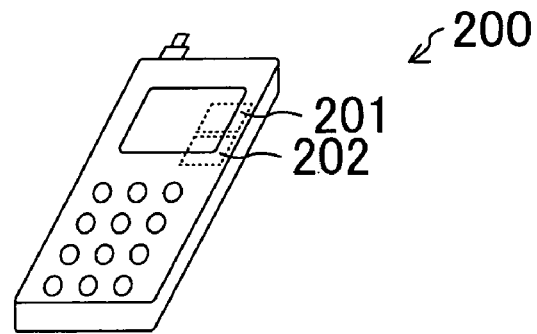
FIG. 8 is a schematic diagram showing a communications device including a semiconductor integrated circuit of the present invention.

FIG. 8 is a schematic diagram showing a communications device including a semiconductor integrated circuit of the present invention. A mobile telephone 200 includes a baseband LSI 201 and an application LSI 202 each having a circuit configuration as described above. Since a semiconductor integrated circuit of the present invention can operate with smaller power consumption as compared with conventional techniques, the baseband LSI 201, the application LSI 202, and the mobile telephone 200 including the same can also operate with low power consumption. The semiconductor integrated circuit of the present invention is applicable to communications devices in general, including transmitters, receivers and modems in communications systems. Thus, the present invention can reduce the power consumption with any type of communications devices, whether the connection is wired or wireless, optical or electric, digital or analog.

Figure 9:
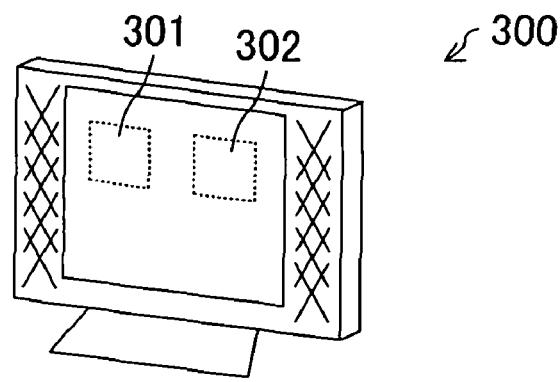
FIG. 9 is a schematic diagram showing an AV device including a semiconductor integrated circuit of the present invention.

FIG. 9 is a schematic diagram showing an AV device including a semiconductor integrated circuit of the present invention. A television set 300 includes an image/sound processing LSI 301 and a display/sound source control LSI 302 each having a circuit configuration as described above. Since a semiconductor integrated circuit of the present invention can operate with smaller power consumption as compared with conventional techniques, the image/sound processing LSI 301, the display/sound source control LSI 302, and the television set 300 including the same can also operate with low power consumption. The semiconductor integrated circuit of the present invention is applicable to AV devices in general, including optical disc recording devices, digital still cameras and digital video cameras.

Figure 10:
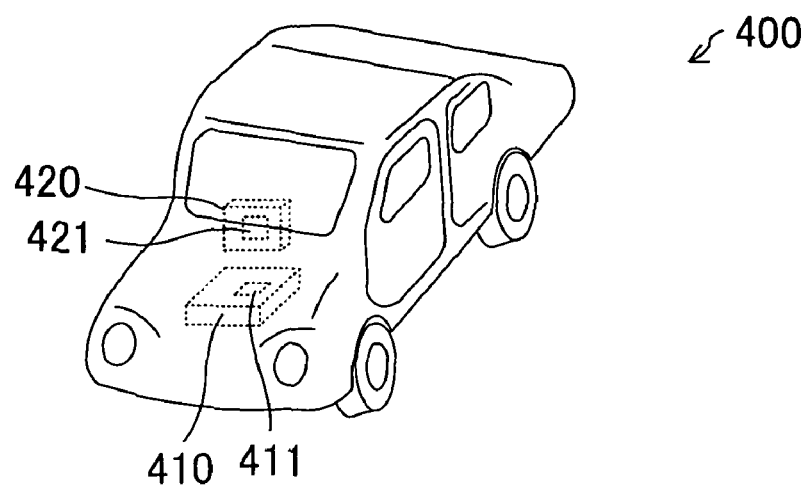
FIG. 10 is a schematic diagram showing a vehicle including a semiconductor integrated circuit of the present invention.

FIG. 10 is a schematic diagram showing a vehicle including a semiconductor integrated circuit of the present invention. An automobile 400 includes an electronic control device 410. The electronic control device 410 includes an engine/transmission control LSI 411 having a circuit configuration as described above. The automobile 400 also includes a navigation system 420. The navigation system 420 includes a navigation LSI 421 also having a circuit configuration as described above. Since a semiconductor integrated circuit of the present invention can operate with smaller power consumption as compared with conventional techniques, the engine/transmission control LSI 411 and the electronic control device 410 including the same can also operate with low power consumption. Similarly, the navigation LSI 421 and the navigation system 420 including the same can operate with low power consumption. With the reduction in the power consumption of the electronic control device 410, it is possible to also reduce the power consumption of the automobile 400. The semiconductor integrated circuit of the present invention is applicable to vehicles in general, e.g., trains and airplanes, having a power source such as an engine or motor.

INDUSTRIAL APPLICABILITY

The semiconductor integrated circuit of the present invention, with which the power consumption can be reduced particularly when the FBB control is performed, is useful as an IC card or a battery-powered product for mobile applications, e.g., a notebook PC, a mobile telephone and a portable music player.

What is claimed is:

1. A semiconductor integrated circuit including a plurality of functional blocks, wherein:
a substrate voltage input terminal of an insulated-gate field effect transistor of a first conductivity type included in a first functional block and a source voltage input terminal of an insulated-gate field effect transistor of a second conductivity type included in the first functional block are respectively connected with a substrate voltage input terminal of an insulated-gate field effect transistor of the second conductivity type included in a second functional block and a source voltage input terminal of an insulated-gate field effect transistor of the first conductivity type included in the second functional block; and
a plurality of constant voltage circuits, each of which supplies predetermined voltages to a substrate voltage input terminal of an insulated-gate field effect transistor of the first conductivity type included in one of the plurality of functional blocks or to a source voltage input terminal of an insulated-gate field effect transistor of the second conductivity type included in the one of the plurality of functional blocks,
wherein at least one of the plurality of constant voltage circuits includes four voltage output terminals connected to the source voltage input terminals and the substrate voltage input terminals of the insulated-gate field effect transistors of the first and second conductivity types included in one of the plurality of functional blocks, respectively, and a voltage selected according to an input signal is output from each of the four voltage output terminals.

2. A semiconductor integrated circuit including a plurality of functional blocks, wherein:
a substrate voltage input terminal of an insulated-gate field effect transistor of a first conductivity type included in a first functional block and a source voltage input terminal of an insulated-gate field effect transistor of a second conductivity type included in the first functional block are respectively connected with a substrate voltage input terminal of an insulated-gate field effect transistor of the second conductivity type included in a second functional block and a source voltage input terminal of an insulated-gate field effect transistor of the first conductivity type included in the second functional block, wherein:
at least one of the plurality of functional blocks has a triple-well structure including a semiconductor substrate of a first one of the first and second conductivity types with a retrograde well of a second one of the first and second conductivity types being formed on the semiconductor substrate, and with a well of the first one of the first and second conductivity types being formed on the retrograde well, and
the retrograde well is insulated from the semiconductor substrate by an insulating layer.

3. A semiconductor integrated circuit including a plurality of functional blocks, wherein:
a substrate voltage input terminal of an insulated-gate field effect transistor of a first conductivity type included in a first functional block and a source voltage input terminal of an insulated-gate field effect transistor of a second conductivity type included in the first functional block are respectively connected with a substrate voltage input terminal of an insulated-gate field effect transistor of the second conductivity type included in a second functional block and a source voltage input terminal of an insulated-gate field effect transistor of the first conductivity type included in the second functional block, wherein:
at least one of the plurality of functional blocks includes: a plurality of first lines for supplying a substrate voltage for an insulated-gate field effect transistor of the first conductivity type included in the functional block; and a plurality of second lines for supplying a substrate voltage for an insulated-gate field effect transistor of the second conductivity type included in the functional block,
the first and second lines extend parallel to each other and alternate with each other, with the insulated-gate field effect transistors of the first and second conductivity types being interposed therebetween, and
the at least one function block includes a line control section for thinning out voltages supplied through the plurality of first and second lines according to a magnitude of a forward body bias to be applied to each of the insulated-gate field effect transistors of the first and second conductivity types included in the functional block.

4. A semiconductor integrated circuit including a plurality of functional blocks, wherein:
a substrate voltage input terminal of an insulated-gate field effect transistor of a first conductivity type included in a first functional block and a source voltage input terminal of an insulated-gate field effect transistor of a second conductivity type included in the first functional block are respectively connected with a substrate voltage input terminal of an insulated-gate field effect transistor of the second conductivity type included in a second functional block and a source voltage input terminal of an insulated-gate field effect transistor of the first conductivity type included in the second functional block, wherein:
at least one of the plurality of functional blocks includes: a plurality of first lines for supplying a substrate voltage for an insulated-gate field effect transistor of the first conductivity type included in the functional block; and a plurality of second lines for supplying a substrate voltage for an insulated-gate field effect transistor of the second conductivity type included in the functional block, the first and second lines extend parallel to each other and alternate with each other, with the insulated-gate field effect transistors of the first and second conductivity types being interposed therebetween, the at least one functional block has a triple-well structure including a semiconductor substrate of one of the first and second conductivity types with a retrograde well of another of the first and second conductivity types being formed on the semiconductor substrate, and with a well of the one of the first and second conductivity types being formed on the retrograde well, and one of the first and second lines that supplies a substrate voltage to an insulated-gate field effect transistor of another one of the first and second conductivity types is located on the retrograde well outside a region of the well.

5. A semiconductor integrated circuit including a first to a fourth functional blocks, wherein:

a source voltage input terminal of an insulated-gate field effect transistor of a first conductivity type included in the first functional block and a substrate voltage input terminal of an insulated-gate field effect transistor of a second conductivity type included therein are connected to a first and a second voltage supply terminals, respectively;

a substrate voltage input terminal of an insulated-gate field effect transistor of the first conductivity type included in an ith (where $1 \leq i \leq 3$) functional block and a source voltage input terminal of an insulated-gate field effect transistor of the second conductivity type included therein are connected respectively with a source voltage input terminal of an insulated-gate field effect transistor of the first conductivity type included in an i+1th functional block and a substrate voltage input terminal of an insulated-gate field effect transistor of the second conductivity type included therein;

a substrate voltage input terminal of an insulated-gate field effect transistor of the first conductivity type included in the fourth functional block and a source voltage input terminal of an insulated-gate field effect transistor of the second conductivity type included therein are connected to a third and a fourth voltage supply terminals, respectively;

a substrate voltage input terminal of an insulated-gate field effect transistor of the first conductivity type included in the second functional block and a substrate voltage input terminal of the insulated-gate field effect transistor of the second conductivity type included in the fourth functional block are connected together; and a source voltage input terminal of an insulated-gate field effect transistor of the second conductivity type included in the second functional block and a source voltage input terminal of the insulated-gate field effect transistor of the first conductivity type included in the fourth functional block are connected together.

* * * * *